(12) United States Patent
Sugeta et al.

(10) Patent No.: US 6,399,275 B1
(45) Date of Patent: Jun. 4, 2002

(54) NEGATIVE-WORKING PHOTOLITHOGRAPHIC PATTERNING MATERIAL AND METHOD FOR THE PREPARATION OF ION-IMPLANTED AND METAL-PLATED SUBSTRATES BY USING THE SAME

(75) Inventors: Yoshiki Sugeta; Kimitaka Morio, both of Yokohama; Takayuki Haraguchi, Kanagawa-ken, all of (JP)

(73) Assignee: Tokyo Ohka Kogyo Co., Ltd., Kanagawa-ken (JP)

( * ) Notice: Subject to any disclaimer, the term of this patent is extended or adjusted under 35 U.S.C. 154(b) by 0 days.

(21) Appl. No.: 09/707,890

(22) Filed: Nov. 8, 2000

(30) Foreign Application Priority Data

Nov. 15, 1999 (JP) ............................ 11-323629

(51) Int. Cl.[7] .............................. G03F 7/004
(52) U.S. Cl. ................ 430/270.1; 430/315; 430/325
(58) Field of Search ................ 430/325, 315, 430/270.1

(56) References Cited

U.S. PATENT DOCUMENTS 4,612,270 A * 9/1986 Pampalona et al. ......... 430/273
5,892,095 A * 4/1999 Hada et al. ................. 558/388
6,228,563 B1 * 5/2001 Starov et al. ............... 430/325

FOREIGN PATENT DOCUMENTS

| JP | 6-118646 | 4/1994 |
| JP | 6-118647 | 4/1994 |

* cited by examiner

*Primary Examiner*—Rosemary Ashton
(74) *Attorney, Agent, or Firm*—Wenderoth, Lind & Ponack, LLP

(57) ABSTRACT

Disclosed is a negative-working photolithographic patterning material consisting of a substrate and a negative-working photoresist layer having a relatively large thickness on the substrate surface which is suitable for the formation of a patternwise masking layer in a patternwise ion-implantation or metal plating treatment. The negative working photoresist layer is formed from a negative-working chemical amplification photoresist composition comprising an alkali-soluble resinous ingredient, a radiation-sensitive acid-generating agent and a crosslinking agent, of which the alkali-soluble resinous ingredient is a m-cresol novolak resin prepared by the acid-catalyzed condensation reaction of formaldehyde and m-cresol alone as the phenolic reactant or a combination of such a m-cresol novolak resin and a polyhydroxystyrene resin of which at least 50% by weight is the m-cresol novolak resin.

12 Claims, No Drawings

NEGATIVE-WORKING PHOTOLITHOGRAPHIC PATTERNING MATERIAL AND METHOD FOR THE PREPARATION OF ION-IMPLANTED AND METAL-PLATED SUBSTRATES BY USING THE SAME

BACKGROUND OF THE INVENTION

The present invention relates to a negative-working photolithographic patterning material capable of giving, in the manufacturing process of semiconductor devices and the like, a patterned resist layer having a relatively large film thickness, excellent heat resistance and good cross sectional profile with good developability and suitable for use as a masking layer when a substrate such as a semiconductor silicon wafer is subjected to a treatment of ion implantation, plating and the like as well as to an efficient method for the preparation of an ion-implanted and metal-plated substrates by using the same.

Several types of alkali-developable photoresist compositions are known in the prior art including positive-working photoresist compositions comprising a novolak resin and a quinone diazidosulfonate ester which are relatively inexpensive and widely employed in the manufacture of semiconductor devices and the like involving a process of metal plating, ion implantation and the like.

In recent years, negative-working chemical-amplification photoresist compositions are highlighted and employed in the above mentioned applications in respect of the high photosensitivity accomplished by virtue of the chain reaction by the acid catalyst generated from an acid-generating agent as an essential ingredient of the composition.

The above mentioned negative-working chemical-amplification photoresist compositions are formulated, in general, with an alkali-soluble resinous ingredient which can be a novolak resin prepared from m- and p-cresols in combination or a polyhydroxystyrene resin, a radiation-sensitive acid generating agent and a crosslinking agent such as an alkoxy-methylated melamine resin and the like.

When a negative-working chemical-amplification photoresist composition is used as a masking in the process of plating, however, troubles are sometimes encountered that cracks are formed in the masking, i.e. non-plating, areas of the resist layer. When the photoresist composition is used in the process of ion implantation, on the other hand, the process cannot be fully efficient because the development treatment of the photoresist layer takes a time longer than 60 seconds usually required in the ion-implantation process to obtain a satisfactorily patterned resist layer in addition to the defects of low pattern resolution and heat resistance.

In order for the patterned resist layer to serve as a mask, the thickness of the patterned resist layer should be at least 4.0 $\mu$m in the process of plating and in the range from 0.5 to 10.0 $\mu$m or, desirably, from 4.0 to 10.0 $\mu$m in the process of ion implantation in consideration of the particularly hard conditions thereof.

As is described above, the patterned resist layer used for masking in the processes of plating, ion implantation and the like must have a thickness considerably larger than the thickness of the resist layer in other general processes in the manufacture of semiconductor devices, which is usually around 1.0 $\mu$m. When the thickness of the photoresist layer is so large as mentioned above, conventional negative-working chemical amplification photoresist compositions cannot be quite satisfactory because the exposure light such as the i-line light and excimer laser beams penetrating the resist layer can hardly reach the bottom surface of the resist layer with a sufficiently high intensity so that the orthogonality of the cross sectional profile of the patterned resist layer can hardly be high enough.

In compliance with the incentive toward cost reduction in the industries in general, on the other hand, development of an inexpensive photoresist composition is an important problem in the electronic industry. Accordingly, it is eagerly desired for the process of plating to develop an inexpensive negative-working chemical amplification photoresist composition suitable for the formation of a photoresist layer of a large thickness capable of giving a patterned resist layer having a cross sectional profile of good orthogonality and still free from occurrence of cracks in the plating process. It is also desired for the process of ion implantation to develop a negative-working chemical amplification photoresist composition which satisfies the requirement for the time taken for development not exceeding 60 seconds in addition to the requirements for the process of plating.

SUMMARY OF THE INVENTION

The present invention accordingly has an object, in view of the above described problems and disadvantages relative to the photoresist compositions as a masking material in the processes of ion implantation and plating onto a substrate such as a semiconductor silicon wafer, to provide an inexpensive negative-working photolithographic patterning material capable of giving a masking layer of a large thickness having excellent heat resistance and good orthogonality of the cross sectional profile along with developability within a short time and high pattern resolution.

The present invention also has an object to provide a method for the preparation of a patternwise ion-implanted or metal-plated substrate by utilizing the above mentioned patterning material.

Thus, the negative-working photolithographic patterning material provided by the present invention comprises:
(a) a substrate; and
(b) a negative-working photoresist layer having a thickness in the range from 4.0 to 10.0 $\mu$m and formed on the surface of the substrate from a negative-working chemical amplification photoresist composition comprising, as a uniform solution in an organic solvent:
  (A) 100 parts by weight of an alkali-soluble resin which is a m-cresol novolak resin as a product of an acid-catalyzed condensation reaction of m-cresol and formaldehyde;
  (B) from 1 to 20 parts by weight of a radiation-sensitive acid-generating compound; and
  (C) from 3 to 50 parts by weight of a crosslinking agent which is a compound having functional groups selected from hydroxyalkyl groups and alkoxyalkyl groups.

The alkali-soluble resin as the component (A) can be a combination of the m-cresol novolak resin and a polyhydroxystyrene resin in a weight proportion of at least 5:5 or, preferably, in the range from 5:5 to 9:1.

The present invention has a further object to provide a method for the preparation of a patternwise ion-implanted or metal-plated substrate which comprises the steps of:
(1) patternwise exposing the photoresist layer of the above defined patterning material to actinic rays;
(2) subjecting the patterning material after patternwise exposure to a heat treatment;
(3) developing the patterning material after the heat treatment to a development treatment with an aqueous alkaline developer solution to form a patterned resist layer; and (4) conducting ion implantation or metal-plating with the patterned resist layer as a mask.

DETAILED DESCRIPTION OF THE PREFERRED EMBODIMENTS

As is described above, the photolithographic patterning material of the present invention is characterized by the photoresist layer having a specific thickness and formed on the surface of a substrate from a specific negative-working chemical amplification photoresist composition comprising the components (A), (B) and (C) as the essential ingredients.

In the photoresist composition used for the formation of the patterning layer in the inventive patterning material, the component (A) is an alkali-soluble resin such as a m-cresol novolak resin prepared by the polycondensation reaction of m-cresol and formaldehyde in the presence of an acid catalyst.

As is well known, the above mentioned m-cresol novolak resin is an inexpensive resinous material having high solubility in an aqueous alkaline medium. This resin, however, is not or rarely employed as a resinous ingredient in the conventional photoresist compositions because the alkali-solubility of the resin is so high as to cause an unduly large film thickness reduction in the unexposed areas by the alkali development and the patterned resist layer can hardly have a good orthogonal cross sectional profile. Accordingly, the novolak resin used in the prior art as the alkali-soluble resinous ingredient of a photoresist composition is a so-called mixed cresol novolak resin prepared by the acid-catalyzed polycondensation of a mixture of m- and p-cresols and formaldehyde.

It is a quite unexpected finding of the inventors that, when a patterned resist layer of a relatively large thickness is required, a photoresist layer of a negative-working photoresist composition comprising a m-cresol novolak resin as the alkali-soluble resinous ingredient exhibits good development behavior to form a patterned resist layer of high pattern resolution and having an excellently orthogonal cross sectional profile by a development treatment of a short time of 60 seconds or shorter as is required in the process of ion implantation.

When a negative-working photoresist composition, of which the alkali-soluble resinous ingredient is a conventional mixed cresol novolak resin, is used for the photoresist layer of a large thickness, in contrast thereto, the alkali-solubility of the photoresist layer is too low to give a patterned resist layer of high pattern resolution having an orthogonal cross sectional profile.

Another advantage obtained by the use of a m-cresol novolak resin as the resinous ingredient in the negative-working photoresist composition is that the patterned resist layer thereof has high heat resistance with an incipient flow temperature of the resist layer on a substrate by heating is 150° C. or even higher while the incipient flow temperature is about 140° C. when a mixed cresol novolak resin is used as the resinous ingredient of the photoresist composition.

When a substrate having a patterned resist layer by using a m-cresol novolak resin is subjected to the process of plating with the patterned resist layer as the mask, furthermore, the resist layer is free from occurrence of cracks in the course of the plating treatment. This is a further advantage of the inventive patterning material in contrast to the crack formation unavoidable when a polyhydroxystyrene resin is used as the resinous ingredient of a negative-working photoresist composition.

The phenolic compound from which the novolak resin used in the invention is prepared by the acid-catalyzed polycondensation reaction with formaldehyde is limited to m-cresol only which must not be combined with other phenolic compounds such as phenol, p-cresol, xylenol and the like. The formaldehyde can be in the form of formalin and other formaldehyde-releasing compounds. The acid to act as the catalyst for the polycondensation reaction of m-cresol and formaldehyde is not particularly limitative including hydrochloric acid, oxalic acid, p-toluene sulfonic acid and others.

The above described m-cresol novolak resin is a known material and several grades of m-cresol novolak products are commercially available.

The m-cresol novolak resin used in the invention should have a weight-average molecular weight in the range from 6000 to 10000 or, preferably, from 7000 to 8000 from the standpoint of obtaining a patterned resist layer of excellent pattern resolution and high heat resistance even by a development treatment of a short time not exceeding 60 seconds. It is optional that the component (A) in the invention is a combination of two kinds or more of different grades of m-cresol novolak resin products.

As is mentioned above, the alkali-soluble resin as the component (A) can be a combination of a m-cresol novolak resin and a polyhydroxystyrene resin. When these two types of resins are used in combination, the weight proportion of the resins should be such that at least 50% by weight of the combination is the m-cresol novolak resin. Preferably, the weight proportion of the m-cresol novolak resin and the polyhydroxystyrene resin is in the range from 5:5 to 9:1 from the standpoint of obtaining further improved pattern resolution and heat resistance of the resist layer. When the weight proportion of the polyhydroxystyrene resin is too large, a decrease is caused in the resistance of the resist layer against wet etching and plating if not to mention the economical disadvantage due to the expensiveness of the polyhydroxystyrene resin. The polyhydroxystyrene resin should preferably have a weight-average molecular weight in the range from 2000 to 5000.

The acid-generating agent as the component (B) in the negative-working chemical amplification photoresist composition is a compound capable of releasing an acid when irradiated with actinic rays. A variety of known compounds can be used as the acid-generating agent in the invention including onium salt compounds such as iodonium and sulfonium salts, triazine compounds having a trichloromethyl group, oximesulfonate compounds, bisalkyl- or bisarylsulfonyl diazomethane compounds, nitrobenzyl sulfonate compounds, iminosulfonate compounds, disulfone compounds and the like.

In the negative-working patterning material of the invention, in which the photoresist layer has a relatively large thickness, it is important that the radiation-sensitive acid-generating agent has a high transmissivity to the light for patternwise exposure or, in particular, i-line light and is capable of generating an acid with a high efficiency. In this regard, it is preferable that the acid-generating agent in the invention is selected from oximesulfonate compounds among the above named various classes of compounds.

In respect of the requirement that the acid-generating agent should have sublimatability as low as possible, it is preferable that the oximesulfonate compound is a compound having at least two oximesulfonate groups represented by the general formula

R—SO$_2$—O—N=C(CN)—, (I)

in which R is an unsubstituted or substituted alkyl or aryl group, in a molecule and capable of releasing a sulfonic acid by the decomposition of these groups under irradiation with actinic rays.

The alkyl group denoted by R in the above given general formula (I) includes straightly linear, branched or cyclic alkyl groups having up to 10 carbon atoms and optionally substituted by halogen atoms exemplified by methyl, trichloromethyl, trifluoromethyl, ethyl, propyl, isopropyl, n-butyl, isobutyl, tert-butyl, pentyl, hexyl, cyclohexyl, heptyl and nonyl groups.

The aryl group denoted by R in the above given general formula (I) has 6 to 15 carbon atoms and can optionally be substituted by alkyl groups, alkoxy groups, halogen atoms, hydroxyl groups, nitro groups and the like exemplified by phenyl, naphthyl, tolyl, methoxyphenyl, bromophenyl and methoxynaphthyl groups.

The above described oximesulfonate compounds are preferable in respect of the high efficiency for the radiation-induced generation of an acid because these compounds each have at least two of the precursor groups which can be decomposed to release a sulfonic acid molecules.

Examples of such oximesulfonate compounds include those represented by the general formula

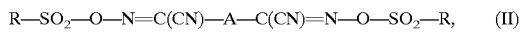
R—SO$_2$—O—N=C(CN)—A—C(CN)=N—O—SO$_2$—R, (II)

in which R has the same meaning as defined above and A is a divalent organic group exemplified by alkylene groups such as methylene, ethylene and propylene groups and arylene groups such as phenylene group, of which phenylene group is preferable. The group denoted by R here is preferably an alkyl group having 1 to 4 carbon atoms.

Particular compounds to meet the definition of the general formula (II), which can be used either singly or as a combination of two kinds or more and are suitable for use in the present invention, include those expressed by the structural formulas:

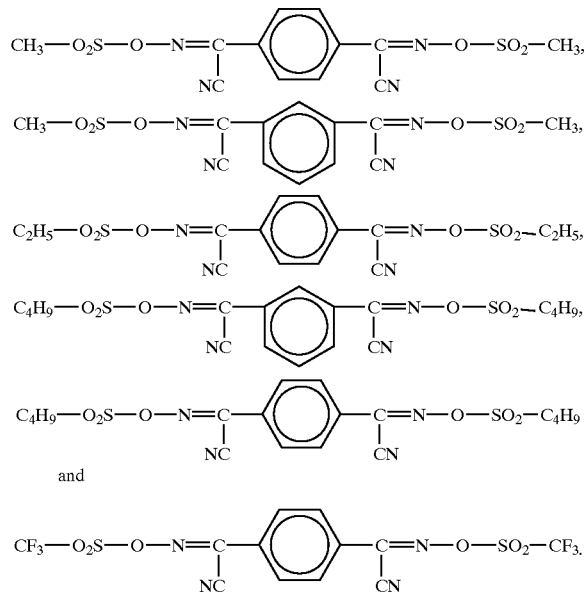

and

In the negative-working chemical amplification photoresist composition used in the present invention, the amount of the above described component (B) is in the range from 1 to 20 parts by weight or, preferably, from 2 to 10 parts by weight per 100 parts by weight of the component (A). When the amount of the component (B) is too small, the crosslinking reaction cannot proceed at an appropriate rate so that a desirable patterned resist layer can hardly be obtained. When the amount of the component (B) is too large, on the other hand, the photoresist composition suffers a decrease in the storage stability and the photosensitivity of the photoresist composition is gradually decreased in the lapse of time.

The crosslinking agent as the component (C) formulated in the negative-working chemical amplification photoresist composition used in the invention is not particularly limitative and can be selected from various compounds having crosslinkable groups such as hydroxyalkyl groups and alkoxyalkyl groups in the molecule.

Examples of the crosslinking agent include various kinds of amino resins having hydroxyalkyl and/or alkoxy-alkyl groups in the molecule such as melamine resins, urea resins, guanamine resins, glycoluril/formaldehyde resins, succinylamide/formaldehyde resins, ethyleneurea/formaldehyde resins and the like. These resins can be prepared by the reaction of melamine, urea, guanamine, glycoluril, succinylamide, ethyleneurea and the like with formaldehyde in boiling water to effect methylolation, optionally, followed by the reaction of the methylolated compound with a lower alcohol to effect alkoxylation of the methylol groups. Several commercial products of amino resins of this type are available on the market including those sold under the trade names of Nikalacs MX-750, MW-30 and MX-290 (each a product by Sanwa Chemical Co.).

Besides the above described amino resin compounds, the crosslinking agent as the component (C) can be selected from benzene compounds substituted by alkoxy groups such as 1,3,5-tris(methoxymethoxy) benzene, 1,2,4-tris (isopropoxymethoxy) benzene and 1,4-bis(sec-butoxymethoxy) benzene and phenolic compounds substituted by hydroxyalkyl and/or alkoxyalkyl groups such as 2,6-dihydroxymethyl-p-cresol and 2,6-dihydroxymethyl-p-tert-butyl phenol. These crosslinking agents can be used either singly or as a combination of two kinds or more as the component (C).

Among the above described various crosslinking agents, alkoxymethylated melamine resins and alkoxymethylated urea resins are preferable for the inventive patterning materials to be subjected to the process of ion implantation or plating in respect of good stability and resistance of the patterned resist layer against the treatment.

The amount of the component (C) formulated in the negative-working chemical amplification photoresist composition used in the invention is in the range from 3 to 50 parts by weight or, preferably, from 10 to 20 parts by weight per 100 parts by weight of the component (A). When the amount of the component (C) is too small, the crosslinking reaction of the photoresist composition cannot fully proceed not to give a satisfactory patterned resist layer while, when the amount of the component (C) is too large, the photoresist composition suffers a decrease in the storage stability and a decrease in the photosensitivity in the lapse of time as a trend.

Though optional, the negative-working chemical amplification photoresist composition used in the invention can be admixed with an aliphatic amine compound as the component (D) with an object to improve resolution of the patterned resist layer obtained from the composition and/or a carboxylic acid as the component (E) with an object to improve the storage stability of the composition.

Examples of the aliphatic amine compounds suitable as the component (D) include trimethylamine, mono-, di- and triethylamines (mono-, di- and triethanolamines, mono-, di- and tripropylamines, mono-, di- and tripropanolamines, mono-, di- and tributylamines, mono-, di- and tripentylamines and mono-, di- and trihexylamines. These amine compounds can be used either singly or as a combination of two kinds or more.

The amount of the component (D), when added, in the photoresist composition is in the range from 0.01 to 1.0 part by weight per 100 parts by weight of the component (A).

Examples of the carboxylic acid suitable as the component (E) include saturated and unsaturated aliphatic carboxylic acids such as butyric acid, isobutyric acid, oxalic acid, malonic acid, succinic acid, acrylic acid, crotonic acid, isocrotonic acid, 3-butenoic acid, methacrylic acid and 4-pentenoic acid, alicyclic carboxylic acids such as 1,1-cyclohexane dicarboxylic acid, 1,2-cyclohexane dicarboxylic acid, 1,3-cyclohexane dicarboxylic acid, 1,4-cyclohexane dicarboxylic acid and 1,1-cyclohexyl diacetic acid and aromatic carboxylic acids substituted by hydroxyl, nitro, carboxyl and/or vinyl groups such as 4-hydroxybenzoic acid, 2-hydroxybenzoic acid, 2-hydroxy-3-nitrobenzoic acid, 3,5-dinitrobenzoic acid, 2-nitrobenzoic acid, 2,4-dihydroxybenzoic acid, 2,5-dihydroxybenzoic acid, 2,6-dihydroxybenzoic acid, 3,4-dihydroxybenzoic acid, 3,5-dihydroxybenzoic acid, 2-vinyl benzoic acid, 4-vinyl benzoic acid, phthalic acid, terephthalic acid and isophthalic acid.

Although any of these carboxylic acids can be used as the component (E) either singly or as a combination of two kinds or more, aromatic carboxylic acids are preferable in respect of the adequate acid strength or salicylic acid, i.e. 2-hydroxybenzoic acid, is more preferable in respect of the good solubility in the solvent of the photoresist composition and excellent pattern-forming behavior on various substrate surfaces.

The amount of the component (E), when added, in the photoresist composition is in the range from 0.01 to 1.0 part by weight per 100 parts by weight of the component (A).

The negative-working chemical amplification photoresist composition is prepared usually in the form of a uniform solution by dissolving the above described essential and optional ingredients in an organic solvent. Examples of the organic solvents suitable for this purpose include ketones such as acetone, methyl ethyl ketone, cyclohexanone, methyl isoamyl ketone and 2-heptanone, polyhydric alcohols and derivatives thereof such as ethyleneglycol, ethyleneglycol monoacetate, diethyleneglycol, diethyleneglycol monoacetate, propyleneglycol, propyleneglycol monoacetate, dipropyleneglycol, dipropyleneglycol monoacetate as well as monomethyl, monoethyl, monopropyl, monobutyl and monophenyl ethers thereof, cyclic ethers such as dioxane and esters such as methyl lactate, ethyl lactate, methyl acetate, ethyl acetate, butyl acetate, methyl pyruvate, ethyl pyruvate, methyl methoxypropionate and ethyl ethoxypropionate. These organic solvents can be used either singly or as a mixture of two kinds or more.

It is optional with an object to improve the properties that the photoresist composition is further admixed with a variety of known additives including additional resinous compounds, plasticizers, stabilizers, coloring agents and surface active agents each in a limited amount.

The above described photoresist composition is used for forming a photoresist layer of the inventive photolithographic patterning material by coating the surface of a substrate which, in most cases, is a semiconductor silicon wafer.

Thus, the substrate surface is coated with the photoresist composition by using a suitable coating machine such as a spinner followed by drying of the coating layer to form a negative-working photolithographic patterning material of the invention. In consideration of the service of this photoresist layer as a masking layer in the subsequent process of ion implantation or plating treatment, the photoresist layer should have a thickness in the range from 4.0 to 10.0 µm or, preferably, from 5.5 to 8.5 µm.

Following is the procedure for the preparation of a patternwise ion-implanted or plated substrate by using the inventive patterning material. Thus, the negative-working photolithographic patterning material prepared in the above described manner is subjected successively according to the conventional photolithographic method to patternwise exposure to actinic rays, post-exposure baking treatment and development with an aqueous alkaline developer solution to form a negatively patterned resist layer on the substrate surface. Thereafter, the process of ion implantation or plating of the patternwise exposed substrate surface is conducted according to a known method with the patterned resist layer as a masking layer.

The above mentioned patternwise exposure of the photoresist layer is undertaken usually on a minifying projection exposure machine through a pattern-bearing photomask with ultraviolet light or, in particular, i-line light, deep ultraviolet light, excimer laser beams and the like. The aqueous alkaline developer solution used in the development treatment is typically a 1 to 10% by weight aqueous solution of tetramethylammonium hydroxide, though not particularly limitative thereto. The development treatment can be completed usually within 60 seconds.

The patterned resist layer formed on the substrate surface according to the above described procedure has excellent pattern resolution and an excellently orthogonal cross sectional profile along with high heat resistance and denseness.

When a substrate provided on the surface with a patterned resist layer as a masking layer can be subjected to a plating treatment by which a metallic plating layer is formed on the areas of the substrate surface uncovered by the masking layer. The patterned resist layer in the plating treatment is safe from occurrence of cracks as is sometimes unavoidable with conventional patterning materials.

In the following, the present invention is described in more detail by way of Examples which, however, never limit the scope of the invention in any way.

EXAMPLE 1

A negative-working photoresist composition was prepared by dissolving, in a mixture of 134 parts by weight of propyleneglycol monomethyl ether acetate and 33 parts by weight of ethyl lactate, 100 parts by weight of a m-cresol novolak resin having a weight-average molecular weight of 8000, which was obtained by the condensation reaction of m-cresol and formaldehyde in the presence of oxalic acid according to a conventional procedure, 5 parts by weight of an oximesulfonate compound expressed by the structural formula

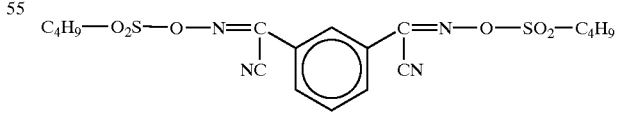

as an acid-generating agent, 15 parts by weight of a hexamethoxymethylated melamine resin (Nikalac Mw-100, a product by Sanwa Chemical Co.), 0.2 part by weight of tripentylamine, 0.1 part by weight of salicylic acid and a fluorosilicone-based non-ionic surface active agent (Megafac R-08, a product by Dai-nippon Ink Chemical Co.) in an amount of 1000 ppm by weight based on the total amount of the solid contents to give a solution which was filtered through a membrane filter of 0.2 μm pore diameter.

A 6-inch semiconductor silicon wafer was coated on the surface with the above prepared negative-working photoresist solution on a spinner followed by drying on a hot plate to form a dried negative-working photoresist layer having a thickness of 6.0 μm on the substrate surface.

In the next place, the photoresist layer on the substrate surface was patternwise exposed to i-line light through a pattern-bearing photomask on a minifying projection exposure machine (Model NSR-2005i10D, manufactured by Nikon Co.) followed by a post-exposure baking treatment at 110° C. for 60 seconds.

The next step to follow was a development treatment of the photoresist layer with a 2.38% by weight aqueous solution of tetramethylammonium hydroxide at 23° C. taking 60 seconds to form a line-and-space patterned resist layer having a line width of 2.0 μm.

The cross sectional profile of the thus obtained line-and-space patterned resist layer was examined on a scanning electron microscopic photograph to find excellent orthogonality.

Further, the heat resistance of the patterned resist layer on the substrate surface was examined by heating the same at different temperatures on a hot plate not to find flow of the resist layer only at a temperature of 155° C.

An ion implantation treatment was undertaken onto the substrate surface with the patterned resist layer as a masking layer to encounter no particular troubles.

EXAMPLE 2

A line-and-space patterned resist layer was formed on the surface of a silicon wafer in the same manner as in Example 1 and the substrate surface was subjected to a dry-process gold plating treatment with the patterned resist layer as a masking to find absolutely no cracks in the patterned resist layer.

EXAMPLE 3

The experimental procedure was substantially the same as in Example 1 excepting for the replacement of the acid-generating agent with the same amount of another oxime-sulfonate compound expressed by the structural formula

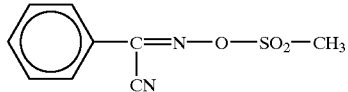

to form a line-and-space patterned resist layer of 2.0 μm line width on the substrate surface.

The cross sectional profile of the thus obtained line-and-space patterned resist layer was examined on a scanning electron microscopic photograph to find excellent orthogonality.

Further, the heat resistance of the patterned resist layer on the substrate surface was examined by heating the same at different temperatures on a hot plate not to find flow of the resist layer only at a temperature of 155° C.

An ion implantation treatment was undertaken onto the substrate surface with the patterned resist layer as a masking layer to encounter no particular troubles.

EXAMPLE 4

A line-and-space patterned resist layer was formed on the surface of a silicon wafer in the same manner as in Example 3 and the substrate surface was subjected to a dry-process gold plating treatment with the patterned resist layer as a masking to find absolutely no cracks in the patterned resist layer.

COMPARATIVE EXAMPLE 1

The formulation of the negative-working photoresist composition was substantially the same as in Example 1 excepting for the replacement of the m-cresol novolak resin with the same amount of a mixed cresol novolak resin having a weight-average molecular weight of 3500 as prepared from a 36:64 by weight mixture of m-cresol and p-cresol.

The thus prepared photoresist composition was subjected to a formation test of line-and-space patterns in the same manner as in Example 1 but line-and-space patterns having a line width finer than 3.0 μm could not be obtained.

The heat resistance of the patterned resist layer on the substrate surface was examined by heating the same at different temperatures on a hot plate to find flow of the resist layer already at 135° C.

COMPARATIVE EXAMPLE 2

The experimental procedure was substantially the same as in Example 1 excepting for the replacement of the m-cresol novolak resin with the same amount of a polyhydroxystyrene resin having a weight-average molecular weight of 3000 (VPS 2515, a product by Nippon Soda Co.). Although a line-and-space patterned resist layer of 2.0 μm line width could be formed on the substrate surface, occurrence of cracks was detected in the patterned resist layer in the gold plating treatment of the substrate surface with the patterned resist layer as a masking.

EXAMPLE 5

A negative-working chemical amplification photoresist solution was prepared in substantially the same formulation as in Example 1 excepting for the replacement of 100 parts by weight of the m-cresol novolak resin with a combination of 90 parts by weight of the same m-cresol novolak resin and 10 parts by weight of a polyhydroxystyrene resin having a weight-average molecular weigh of 3500 with a molecular weight dispersion of 1.3.

The procedure for the evaluation test of the photolithographic patterning material prepared with the above prepared photoresist solution was substantially the same as in Example 1.

According to the examination on a scanning electron microscopic photograph of the thus formed line-and-space pattern of 2.0 μm line width indicated excellent orthogonality of the cross sectional profile.

Further, the heat resistance test of the patterned resist layer indicated that incipient flow of the resist layer could be detected only at 170° C.

No particular troubles were encountered in conducting an ion implantation treatment of the substrate surface with the patterned resist layer as a masking.

EXAMPLE 6

The experimental procedure was substantially the same as in Example 5 except that the weight proportion of the m-cresol novolak resin and the polyhydroxystyrene resin was 70:30 instead of 90:10 in Example 5.

According to the examination on a scanning electron microscopic photograph of the thus formed line-and-space pattern of 2.0 μm line width indicated excellent orthogonality of the cross sectional profile.

Further, the heat resistance test of the patterned resist layer indicated that incipient flow of the resist layer could be detected only at 190° C.

No particular troubles were encountered in conducting an ion implantation treatment of the substrate surface with the patterned resist layer as a masking.

What is claimed is:

1. A negative-working photolithographic patterning material which comprises:
   (a) a substrate; and
   (b) a negative-working photoresist layer having a thickness in the range from 4.0 to 10.0 μm and formed on the surface of the substrate from a negative-working chemical amplification photoresist composition comprising, as a uniform solution in an organic solvent:
      (A) 100 parts by weight of an alkali-soluble resin which is a m-cresol novolak resin as a product of an acid-catalyzed condensation reaction of m-cresol and formaldehyde;
      (B) from 1 to 20 parts by weight of a radiation-sensitive acid-generating compound;
      (C) from 3 to 50 parts by weight of a crosslinking agent which is a compound having functional groups selected from the group consisting of hydroxyalkyl groups and alkoxyalkyl groups; and
      (D) from 0.01 to 1.0 part by weight of an aliphatic amine compound.

2. The negative-working photolithographic patterning material as claimed in claim 1 in which the negative-working photoresist layer has a thickness in the range from 5.5 to 8.5 μm.

3. The negative-working photolithographic patterning material as claimed in claim 1 in which the m-cresol novolak resin as the component (A) has a weight-average molecular weight in the range from 6000 to 10000.

4. The negative-working photolithographic patterning material as claimed in claim 1 in which the radiation-sensitive acid-generating compound as the component (B) is a compound having, in a molecule, at least two oxime-sulfonate groups represented by the general formula

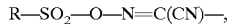
R—SO$_2$—O—N=C(CN)—, in which R is an unsubstituted or substituted alkyl group or aryl group.

5. The negative-working photolithographic patterning material as claimed in claim 4 in which the radiation-sensitive acid-generating compound as the component (B) is a compound represented by the general formula

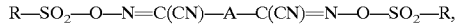
R—SO$_2$—O—N=C(CN)—A—C(CN)=N—O—SO$_2$—R, in which A is a divalent organic group and R has the same meaning as defined above.

6. The negative-working photolithographic patterning material as claimed in claim 5 in which the divalent organic group denoted by A in the general formula is a phenylene group and R is an alkyl group.

7. The negative-working photolithographic patterning material as claimed in claim 1 in which the negative-working chemical amplification photoresist composition further comprises:
   (E) from 0.01 to 1.0 part by weight of a carboxylic acid compound.

8. The negative-working photolithographic patterning material as claimed in claim 1 in which the alkali-soluble resin as the component (A) is a combination of a m-cresol novolak resin and a polyhydroxystyrene resin of which at least 50% by weight is the m-cresol novolak resin.

9. The negative-working photolithographic patterning material as claimed in claim 8 in which the weight proportion of the m-cresol novolak resin and the polyhydroxystyrene resin is in the range from 5:5 to 9:1.

10. The negative-working photolithographic patterning material as claimed in claim 8 in which the polyhydroxystyrene resin has a weight-average molecular weight in the range from 2000 to 5000.

11. A method for the preparation of a patternwise ion-implanted substrate material which comprises the steps of:
   (1) patternwise exposing the negative-working photoresist layer of the photolithographic patterning material defined in claim 1 to actinic rays;
   (2) subjecting the patterning material after patternwise exposure to a heat treatment;
   (3) developing the patterning material after the heat treatment with an aqueous alkaline developer solution to form a patterned resist layer as a masking layer on the substrate surface; and
   (4) conducting ion implantation onto the substrate surface with the patterned resist layer as a mask.

12. A method for the preparation of a patternwise metal-plated substrate material which comprises the steps of:
   (1) patternwise exposing the negative-working photoresist layer of the photolithographic patterning material defined in claim 1 to actinic rays;
   (2) subjecting the patterning material after patternwise exposure to a heat treatment;
   (3) developing the patterning material after the heat treatment with an aqueous alkaline developer solution to form a patterned resist layer as a masking layer on the substrate surface; and
   (4) conducting metal-plating onto the substrate surface with the patterned resist layer as a mask.

* * * * *